(12) United States Patent
Gee et al.

(10) Patent No.: US 11,923,471 B2
(45) Date of Patent: Mar. 5, 2024

(54) DEEP JUNCTION LOW-GAIN AVALANCHE DETECTOR

(71) Applicant: The Regents of the University of California, Oakland, CA (US)

(72) Inventors: Carolyn Gee, Santa Cruz, CA (US); Simone Michele Mazza, Santa Cruz, CA (US); Bruce A. Schumm, Santa Cruz, CA (US); Yuzhan Zhao, Santa Cruz, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 17/772,310

(22) PCT Filed: Oct. 30, 2020

(86) PCT No.: PCT/US2020/058176
§ 371 (c)(1),
(2) Date: Apr. 27, 2022

(87) PCT Pub. No.: WO2021/087237
PCT Pub. Date: May 6, 2021

(65) Prior Publication Data
US 2022/0352400 A1    Nov. 3, 2022

Related U.S. Application Data

(60) Provisional application No. 62/928,775, filed on Oct. 31, 2019.

(51) Int. Cl.
*H01L 31/0352* (2006.01)
*H01L 31/115* (2006.01)
(Continued)

(52) U.S. Cl.
CPC .... *H01L 31/035272* (2013.01); *H01L 31/115* (2013.01); *H01L 31/1804* (2013.01); *H01L 31/0288* (2013.01)

(58) Field of Classification Search
CPC .......... H01L 31/035272; H01L 31/115; H01L 31/1804; H01L 31/0288; H01L 31/107; H01L 27/1443
See application file for complete search history.

(56) References Cited

U.S. PATENT DOCUMENTS 5,021,854 A * 6/1991 Huth ..................... H01L 21/261
257/E27.128
9,728,667 B1    8/2017 Johnson et al.
(Continued)

FOREIGN PATENT DOCUMENTS

WO    2020104220 A1    5/2020

OTHER PUBLICATIONS

PCT International Search Report dated Feb. 5, 2021 for PCT Application No. PCT/US2020/058176.
(Continued)

*Primary Examiner* — Sitaramarao S Yechuri
(74) *Attorney, Agent, or Firm* — GATES & COOPER LLP

(57) ABSTRACT

An avalanche diode including a gain region and a readout structure including an n-type (p-type) region having electrically isolated segments each including implanted regions; a p-type (n-type) region; and a first electrode on each of the segments. The gain region includes a p-n junction buried between the n-type region and the p-type region: an $n^+$-type region having a higher n-type dopant density than the n-type region; a $p^+$-type region having a higher p-type dopant density than the p-type region; and the p-n junction between the $n^+$-type region and the $p^+$-type region. A bias between the (Continued)

first electrodes and a second electrode (ohmically contacting the p-type (n-type) region) reverse biases the p-n junction. Electrons generated in response to electromagnetic radiation or charged particles generate additional electrons m the gain region through impact ionization but the segmented region comprises a low field region isolating the gain region from the first electrodes.

23 Claims, 7 Drawing Sheets

(51) Int. Cl.
*H01L 31/18* (2006.01)
*H01L 31/0288* (2006.01)

(56) References Cited

U.S. PATENT DOCUMENTS

| | | | |
|---|---|---|---|
| 2010/0245809 | A1 | 9/2010 | Andreou et al. |
| 2012/0205731 | A1 | 8/2012 | Henderson et al. |
| 2012/0261729 | A1 | 10/2012 | Finkelstein et al. |
| 2016/0005887 | A1* | 1/2016 | Lo .................. H01L 31/035227 438/71 |
| 2018/0309012 | A1* | 10/2018 | O'Neill ............... H01L 27/1446 |
| 2018/0374890 | A1* | 12/2018 | Cao .................... H01L 31/1075 |
| 2019/0019899 | A1 | 1/2019 | Wang et al. |
| 2019/0157257 | A1 | 5/2019 | Mallikarjunaswamy |
| 2022/0216245 | A1 | 7/2022 | Richter et al. |

OTHER PUBLICATIONS

Pellegrini et al., "echnology developments and first measurements of Low Gain Avalanche Detectors (LGAD) for high energy physics applications". Nuclear Instruments and Methods in Physics Research A 765 (2014) pp. 12-16.

Cartiglia et al., "Design optimization of ultra-fast silicon detectors". Nuclear Instruments and Methods in Physics Research A 796 (2015) pp. 141-148.

Sadrozinski et al., "Ultra-fast silicon detectors (UFSD)". Nuclear Instruments and Methods in Physics Research A 831 (2016) 1pp. 8-23.

Schumm, "LGAD Prospects: Granularity and Repetition Rate". CPAD Instrumentation Frontier Workshop Madison, WisconsinDecember 8-10, 2019, 34 pages.

Extended European Search Report dated Nov. 24, 2022 for European Patent Application No. 20881342.8.

Fernandez-Martinez, P., et al., "Low Gain Avalanche Detectors for High Energy Physics", 2015 10th Spanish Conference on Electron Devices (CDE), IEEE, Feb. 2015, pp. 1-4, XP032764670.

Pellegrini, G., et al., "Recent technological 1-15 developments on LGAD and iLGAD detectors for tracking and timing applications", Nuclear Instruments & Methods in Physics Research A, May 2016, pp. 24-28, vol. 831.

Giacomini, G., et al., "Fabrication and performance of AC-coupled LGADs", arxiv.org, Cornell University Library, 201 Olin Library Cornell University, Jun. 2019, pp. 1-13.

Curras, E., et al., "Inverse Low Gain Avalanche Detectors (ILGADs) for precise tracking and timing applications", rxiv.org, Cornell University Library, 201 Olin Library Cornell University, Apr. 2019, pp. 1-5.

\* cited by examiner

DEEP JUNCTION LOW-GAIN AVALANCHE DETECTOR

CROSS REFERENCE TO RELATED APPLICATIONS

This application claims the benefit under 35 U.S.C 119(e) of co-pending and commonly-assigned U.S. Provisional Patent Application No. 62/928,775, filed Oct. 31, 2019, by Carolyn Gee, Simone Michele Mazza, Bruce A. Schumm, and Yuzhan Zhao, entitled "DEEP JUNCTION LOW-GAIN AVALANCHE DETECTOR", which application is incorporated by reference herein.

BACKGROUND OF THE INVENTION

1. Field of the Invention

The present invention relates to avalanche diodes and methods of making same.

2. Description of the Related Art

Avalanche diodes are used as photon detectors in many applications. The detection process comprises (1) the avalanche diode generating electrons and holes in response to electromagnetic radiation, charged particles, or photons; (2) separating the electrons and holes in the diode using a strong reverse bias voltage applied to the diode; (3) using the strong reverse bias voltage to further accelerate the electrons in the diode and generate additional electrons through impact ionization (an internal gain mechanism); and (4) forming a detection signal using the multiple electrons generated through the impact ionization from each of the photo-generated electrons.

FIG. 1 illustrates a Low-Gain-Avalanche-Detector (LGAD) having an $n^+$-type layer (cathode) forming a junction with a p-type multiplication layer. Electrons are photo-generated in a p-type bulk region in response to the electromagnetic radiation and the $p^-$ type multiplication layer is the gain layer wherein the additional electrons are generated through the impact ionization. A $p^+$-anode is formed on the p-type bulk region so that an ohmic connection can be made between the p-type bulk and an anode plane that allows for the application of a reverse bias voltage across the anode and the cathode. Such an LGAD fabricated in silicon can be used for particle detection, particularly in the arena of ultra-fast (~10 ps) timing. However, the high electric fields needed to induce the impact ionization process lead to breakdown between the separated n-p junctions that are used to simultaneously deplete the sensors and establish the readout segmentation. As a result, working devices have included a Junction Termination Extension (JTE) that provides electrostatic isolation between neighboring implants, but at a cost of introducing a dead region between the sensor segments that is insensitive to the deposited charge from an incident charged particle or photon. The width of this dead region is 50 μm or more, making conventional LGAD sensors inefficient for granularity or spatial resolution scales much below 1 mm.

However, particle physics (4D tracking and photon science (high frame-rate X-Ray imaging) applications require granularity or spatial resolution at the 50 μm scale. Thus, there is a need to overcome the current granularity limits of LGAD sensors. The present disclosure satisfies this need.

SUMMARY OF THE INVENTION

As discussed herein, avalanche diodes use high electric fields to provide signal gain by using a high electric field at or near a p-n junction to generate an "avalanche" of additional signal charge. However, the high electric field can also cause breakdown in the readout structure of the avalanche diode, resulting in a limit to the granularity of the readout from the diode.

The present disclosure describes an avalanche diode, such as a Low-Gain Avalanche Detector (LGAD) comprising a buried junction that localizes the high electric field region and isolates it from the readout structure, thereby solving the problem of granularity limits on the LGADs. in typical examples, a planar, highly-doped diode junction is buried several micrometers below the surface of the device, allowing for a low electric field region in the area close to the surface readout structure while the high electric field region in the area of the junction produces the gain characteristic of LGADs.

In typical embodiments, the buried diode junction eliminates the need for the Junction-Termination Extension (JTE) structure, employed in conventional LGADs, that limits achievable granularity. The significantly higher degree of granularity achievable using embodiments described herein opens up a range of additional applications for the LGAD.

An avalanche photo-diode can be embodied in many ways including, but not limited to, the following.

1. An avalanche diode, comprising:
a semiconductor structure including:
an n-type (p-type) region including a plurality of segments each including an implanted region having a higher dopant density than the n-type (p-type) region;
a p-type (n-type) region; and
a gain region between the n-type (p-type) region and the p-type (n-type) region, the gain region buried between the n-type (p-type) region and the p-type (n-type) region and the gain region including:
an $n^+$-type region having a higher n-type dopant density than the n-type region;
a $p^+$-type region having a higher p-type dopant density than the p-type region; and
a p-n junction between the $n^+$-type region and the $p^+$-type region;
a readout structure comprising a plurality of first electrodes, wherein at least one of the first electrodes is on each of the segments and the first electrodes on different segments are electrically isolated from one another;
each of the segments including a first ohmic contact between the implanted region and the at least one of the first electrodes on the implanted region;
a second ohmic contact between the p-type (n-type) region and a second electrode: and
wherein the p-n junction experiences a reverse bias electric field when an appropriate polarity bias is applied between the first electrodes and the second electrode.

2. The avalanche diode of example 1, wherein the semiconductor structure consists essentially of silicon.

3. The avalanche diode of example 1 or example 2, further comprising:
a first surface of the n-type (p-type) region;
the p-n junction comprising a first interface between the $n^+$-type region and the $p^+$-type region; and
a first distance between the first interface and the first surface, wherein the first distance is in range of 2-10 micrometers.

4. The avalanche diode of example 3, wherein the first distance is in a range of 3-6 micrometers.

5. The avalanche diode of any of the preceding examples, wherein:

the n⁺-region has a first n-type dopant density and the p⁺-type region has a first p-type dopant density, and the first n-type dopant density is within 10% of the first p-type dopant density.

6. The avalanche diode of example 5, wherein the first n-type dopant density and the first p-type dopant density are in a range of 2.6e^16-3.8e^16 dopant atoms per cubic centimeter (cm³).

7. The avalanche diode of any of the preceding examples, wherein:

the n-type region has a second n-type dopant density in a range of 1e^12-1e^14 atoms per cm³, and the p-type region has a second p-type dopant density in a range of 1e^12-1e^14 atoms per cm³.

8. The avalanche diode of any of the preceding examples, further comprising:

a second surface of the p-type (n-type) region on a side of the semiconductor structure opposite the first surface; and a second distance, between the first interface and the second surface, in a range of 20 micrometers to 100 micrometers.

9. The avalanche diode of any of the preceding examples, wherein:

when the diode experiences the reverse bias electric field, a first n-type dopant density in the n⁺-type region and a second p-type dopant density in the p⁺-type region are in a range that achieves gain using impact ionization in the p-n junction without breakdown of the p-n junction; and a second n-type dopant, density in the n-type region and a second p-type dopant density in the p-type region are in a range such that:

the reverse bias electric field does not induce impact ionization in the n-type region or the p-type region, the second p-type dopant density enables saturation of the drift velocity in the p-type region, and the second n-type dopant density enables saturation of the drift velocity in the n-type region.

10. The avalanche diode of any of the preceding examples, wherein:

starting at full depletion and as a function of increasing reverse bias voltage across the first electrodes and second electrode, a gain of the diode increases monotonically until breakdown in the p-n junction; and the gain is characterized as the response of the diode with the p-n junction divided by the response of the diode having:

the p⁺-type region replaced with a continuation of the p-type region (having the same thickness as the p⁺-type region) and the n⁺-type region replaced with a continuation of the n-type region (having the same thickness as the n⁺-type region).

11. The avalanche diode of any of the preceding examples, wherein:

each of the segments has a surface area of 3 by 3 micrometers or greater, or the number density of the segments is up to 10⁵ segments per square millimeter.

12. The avalanche diode of any of the preceding examples, further comprising:

an electrostatic isolation barrier, comprising p-type (n-type) dopant, between adjacent segments, wherein:

the barriers electrically isolate the first electrodes from each other, and the barriers extend to a depth that does not reach the p-n junction.

13. The avalanche diode of example 12, wherein the barriers comprise a third p-type (n-type) dopant density in a range of 1e^12-1e^14 dopant atoms per cm³.

14. The avalanche diode of examples 6, 7 and 12:

wherein the dopant densities in the semiconductor structure are tuned so that the gain of the diode, as a function of position along a length of the segment, in any direction parallel to the first surface, does not vary by more than +/−10%.

15. The avalanche diode of example 14, wherein for the p-type (n-type) region comprising a bulk region having a thickness of 50 micrometers or less, the majority of the signal charge is collected within 500 picoseconds, enabling a repetition rate in excess of 1 GHz.

16. The avalanche diode of any of the preceding examples, wherein the implanted regions comprise a fourth n-type (p-type) dopant density in a range of 1e^17-1.e^19 dopant atoms per cm³.

17. The avalanche diode of any of the preceding examples, wherein the diode does not include a Junction Termination Extension (JTE) structure between the segments.

18. The avalanche diode of any of the preceding examples, wherein:

the n-type (p-type) region, including a plurality of segments, comprises an n-type (p-type) region, and the p-type (n-type) region comprises a p-type bulk region so that the second ohmic contact is between the p-type (n-type) bulk region and the second electrode.

19. A method of making an avalanche diode, comprising:
obtaining or creating a semiconductor structure including:
an n-type (p-type) region;
a p-type (n-type) region; and
a gain region between the n-type region and the p-type region, the gain region buried between the n-type region and the p-type region and the gain region including:
an n⁺-type region having a higher n-type dopant density than the n-type region;
a p⁺-type region having a higher p-type dopant density than the p-type region; and
a p-n junction between the n⁺-type region and the p⁺-type region;
the surface of the n-type (p-type) region forming a readout structure, comprising:
a plurality of segments in the n-type (p-type) region, each of the segments including implanted regions having a higher dopant density than the n-type (p-type) region;
forming a first ohmic contact between the implanted regions and the first electrodes;
generating a plurality of first electrodes, wherein at least one of the first electrodes is on each of the segments and the first electrodes on different segments are electrically isolated from one another; and
forming a second ohmic contact between the p-type (n-type) region and a second electrode, so that the p-n junction is reverse biased by application of an electric field of appropriate polarity between the first electrodes and the second electrode.

20. The method of example 19, wherein the semiconductor consists essentially of silicon.

21. The method of example 19 or 20, wherein the first electrodes are DC coupled to the implanted regions.

22. The method or device of any of the preceding examples wherein:

an electron (hole) is generated in the p-type (n-type) region (comprising a bulk region) in response to incident charged particle(s) or photon(s);

the electron (hole), accelerated in the reverse bias electric field applied across the gain region, generates additional electrons (holes) in the gain region through impact ionization in the gain region, and the n-type (p-type) region (including the segments) isolates the first electrodes from electric fields in the gain region so that there is no breakdown between the implants while allowing the additional electrons (holes) to drift from the gain region through the n-type (p-type) region to the first electrodes.

While electrons or holes generated in response to electromagnetic radiation or charged particles generate additional electrons in the gain region through impact ionization, the segmented n-type (p-type) region comprises a low field region isolating the gain region from the first electrodes.

Note: The dopant densities or levels expressed herein in scientific notation me^n per centimeter cube (cm$^3$), where m is a real number and n is an integer, are equivalent to standard notation m×10$^n$.

BRIEF DESCRIPTION OF THE DRAWINGS

Referring now to the drawings in which like reference numbers represent corresponding parts throughout.

Some of the drawings are better understood when provided in color and the specification makes reference to color versions of the drawings. Applicant considers the color versions of the drawings as part of the original disclosure and reserves the right to provide color versions of the drawings in later proceedings.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

The present disclosure describes an entirely novel approach to the problem of improving the granularity of LGAD sensors—the Deep Junction ("DJ-LGAD") LGAD comprising the high electric-field gain region (wherein impact ionization takes place) moved away from the readout structure.

Example Structure

Figure 1:
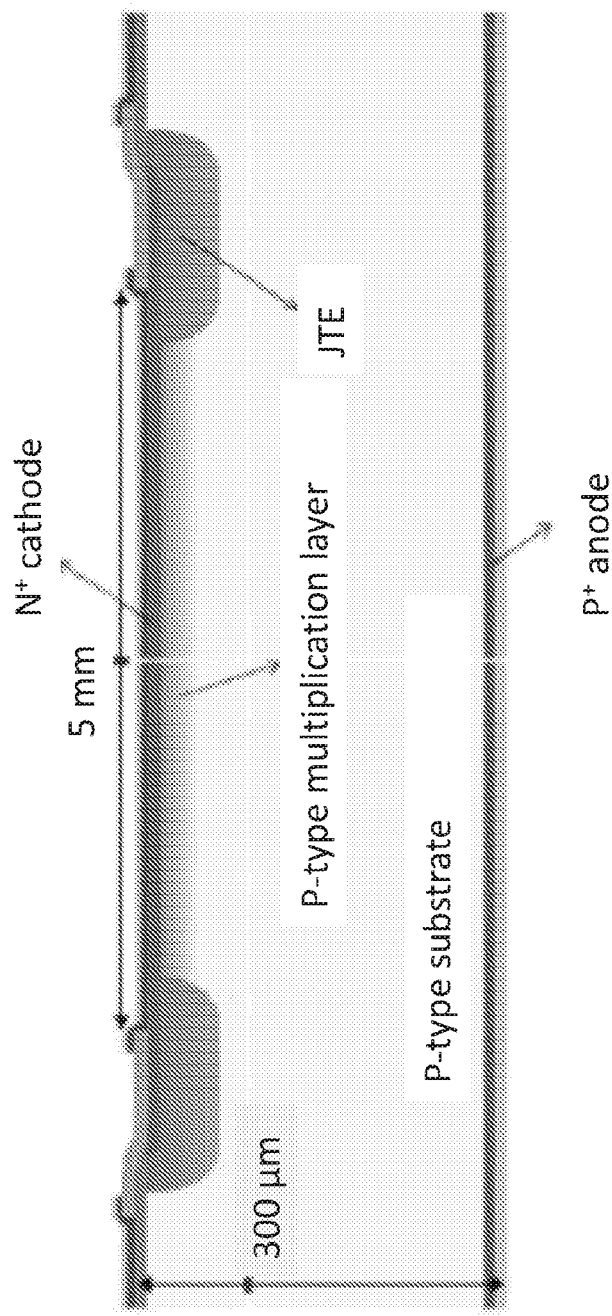
FIG. 1: Conventional LGAD.
Figure 2:
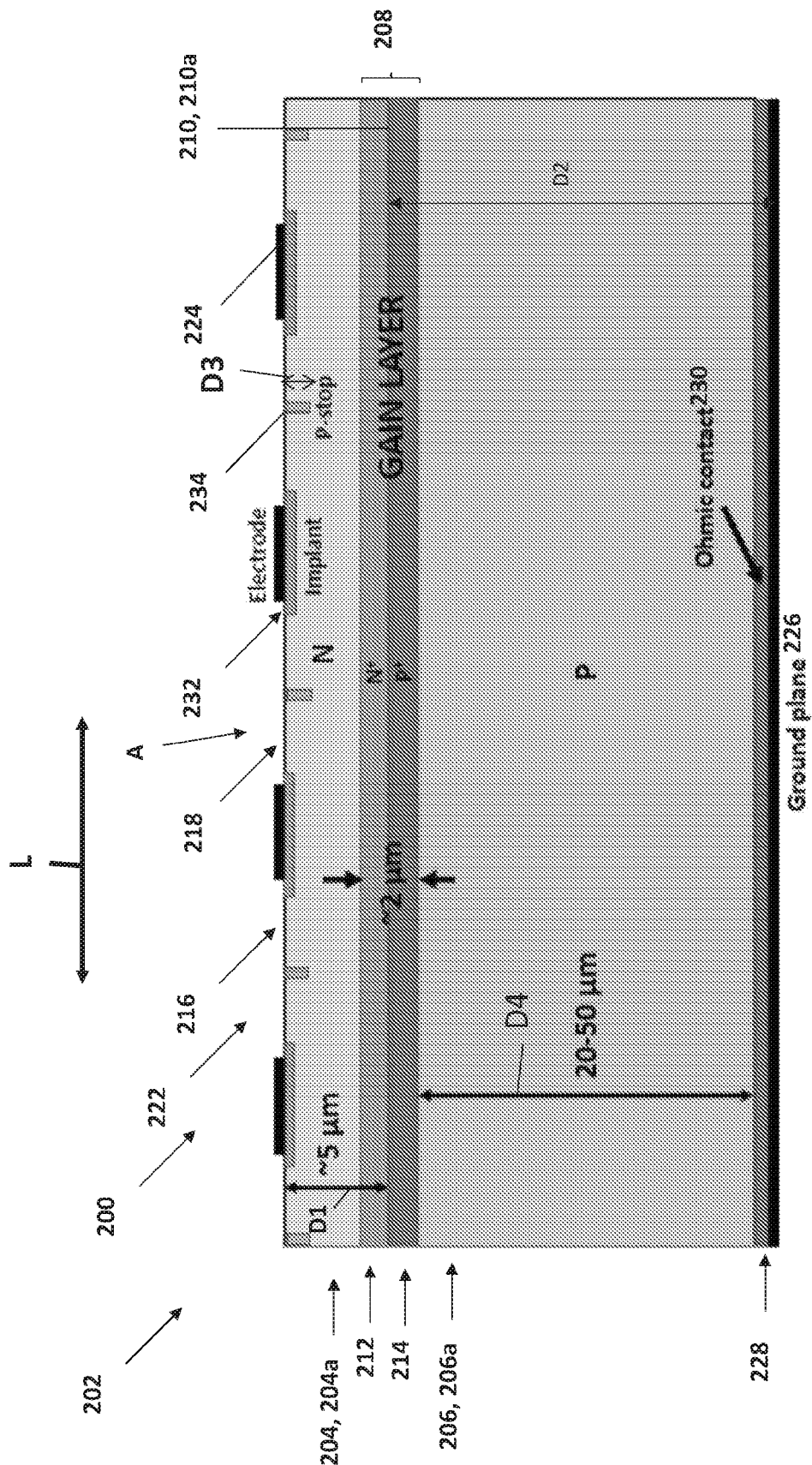
FIG. 2: Schematic of a Deep-Junction LGAD according to one or more examples, illustrating the use of the buried junction to localize the high electric-field region and isolate it from the readout structure.

FIG. 2 illustrates the LGAD comprises a diode (p-n) junction buried a few micrometers below and away from the upper surface of the LGAD (the upper surface comprising the surface where segmentation is imposed). In the example shown, such positioning of the high electric-field gain region avoids the need for the JTE.

More specifically, FIG. 2 illustrates an example avalanche diode 200 including a semiconductor structure 202 including an n-type region 204; a p-type region 206; and a gain region 208 buried between the n-type region 204 and the p-type region 206. The gain region includes an n$^+$-type region 212 having a higher n-type dopant density than the n-type region; a p$^+$-type region 214 having a higher p-type dopant density than the p-type region; and a p-n junction 210 including an interface 210a between the n$^+$-type region and the p$^+$-type region.

The n-type region 204 includes a plurality of segments 218, each of the segments including a first surface 216 of the n-type region 204 and the semiconductor structure.

FIG. 2 further illustrates the avalanche diode as including a readout structure 222 comprising a plurality of first electrodes 224, wherein at least one of the first electrodes is on each of the segments and the first electrodes on different segments are electrically isolated from one another. A second electrode 226 is deposited on a second surface 228 of the semiconductor structure/p-type region and an ohmic contact 230 is formed between the p-type region and the second electrode. The p-n junction is reverse biased by application of an electric field between the first electrodes in the readout structure and the second electrode. As illustrated in FIG. 2, each of the segments include implanted regions 232 having a higher dopant density than the n-type region 204. The implanted regions 232 form an ohmic contact with the first electrodes. Also shown in FIG. 2 are electrostatic isolation barriers 234 (e.g., p-type wells) electrically isolating the segments.

FIG. 2 illustrates the LGAD as comprising a gain layer including both the n$^+$ region (dark blue section) and the p$^+$ region (dark red section), rather than just a dark red section. In other words, the gain layer comprises the full p-n junction, rather than just the p$^+$ doped area. A key benefit of burying the entire junction, rather than just the highly-doped p$^+$ region, is that application of a reverse bias (creating a depletion zone) establishes an electric field in the region of the junction that is similar to that of a parallel-plate capacitor. Specifically, application of the reverse bias voltage creates two planes comprising near equal (but opposite sign) high charge density, so that the electric field in the region of the junction is sufficiently high to induce the limited and controlled impact ionization that is characteristic of LGADs. The electric fields are much lower outside the highly doped junction region, however, thereby avoiding the need to provide isolation between the readout segmentation and the junction.

Example Characterization

The structure of FIG. 2 was simulated with version K_2015.06-SP2 of the Sentaurus Device simulation package from the Synopsys Corporation. A challenge of designing a workable DJ-LGAD is to determine the doping profiles that:

(1) produce the right amount of impact ionization in the gain region, allowing for gain without breakdown; and (2) also permit the electric field in all other regions of the bulk (including the "N isolation layer" between the junction and the readout structure) to be (i) high enough to saturate the drift velocity but (ii) low enough so as to not induce additional, uncontrolled impact ionization that leads to breakdown between segments.

Table 1 illustrates a sample doping profile ("Baseline-1" configuration) that achieves these conditions (1) and (2), while maintaining electric fields at the readout surface low enough to allow for conventional segmentation techniques and avoid the use of a JTE. All further results presented herein are for the simulated behavior of this Baseline-1 configuration.

TABLE 1

Doping profile parameters for the Baseline-1 version of the DJ-LGAD. The dopant densities or levels expressed herein in scientific notation MeN per centimeter cube ($cm^3$), where m is a real number and n is an integer, are equivalent to standard notation m × $10^n$.

| Element | Doping Level | Extent in Depth |
| --- | --- | --- |
| N isolation layer | Constant doping of density 3e12 N/cm^3 | From 0 μm (surface) to beginning of $N^{++}$ "gain plate" layer |
| $N^{++}$ gain plate (upper half of gain layer) | Gaussian doping, peak of 3.0e16 N/cm^3 | Peak at 4 μm, Gaussian width of 0.17 μm |
| $P^{++}$ gain plate (lower half of gain layer) | Gaussian doping, peak of 3.0e16 N/cm^3 | Peak at 5.5 μm, Gaussian width of 0.17 μm |
| P drift region | Constant doping of density 3.0e12 N/cm^3 | End of $P^{++}$ "gain plate" layer to 50 μm |
| P stop | Constant doping of density 1.0e13 N/cm^3 | 1 μm deep, 1 μ wide |
| $N^{++}$ implant | Constant doping of density 1.0e19 N/cm^3 | At surface |
| Gain layer doping tolerance ($N^{++}$ and $P^{++}$ varied together) | Effective operation between 2.9e^16 and 3.5e^16 | |

Figure 3:
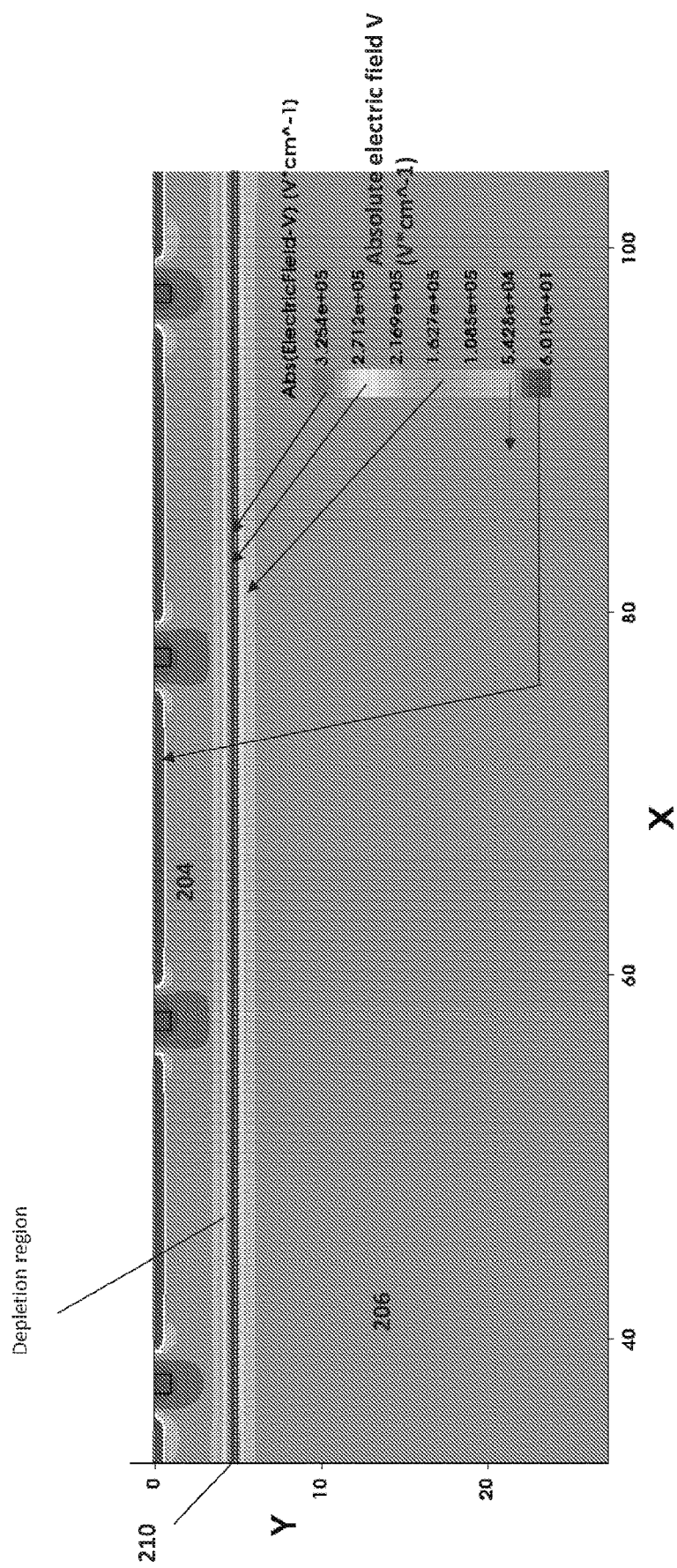
FIG. 3: Two-dimensional electric field profile of the Baseline-1 configuration, at a bias voltage of 210V. The units of the axes are micrometers.
Figure 4:
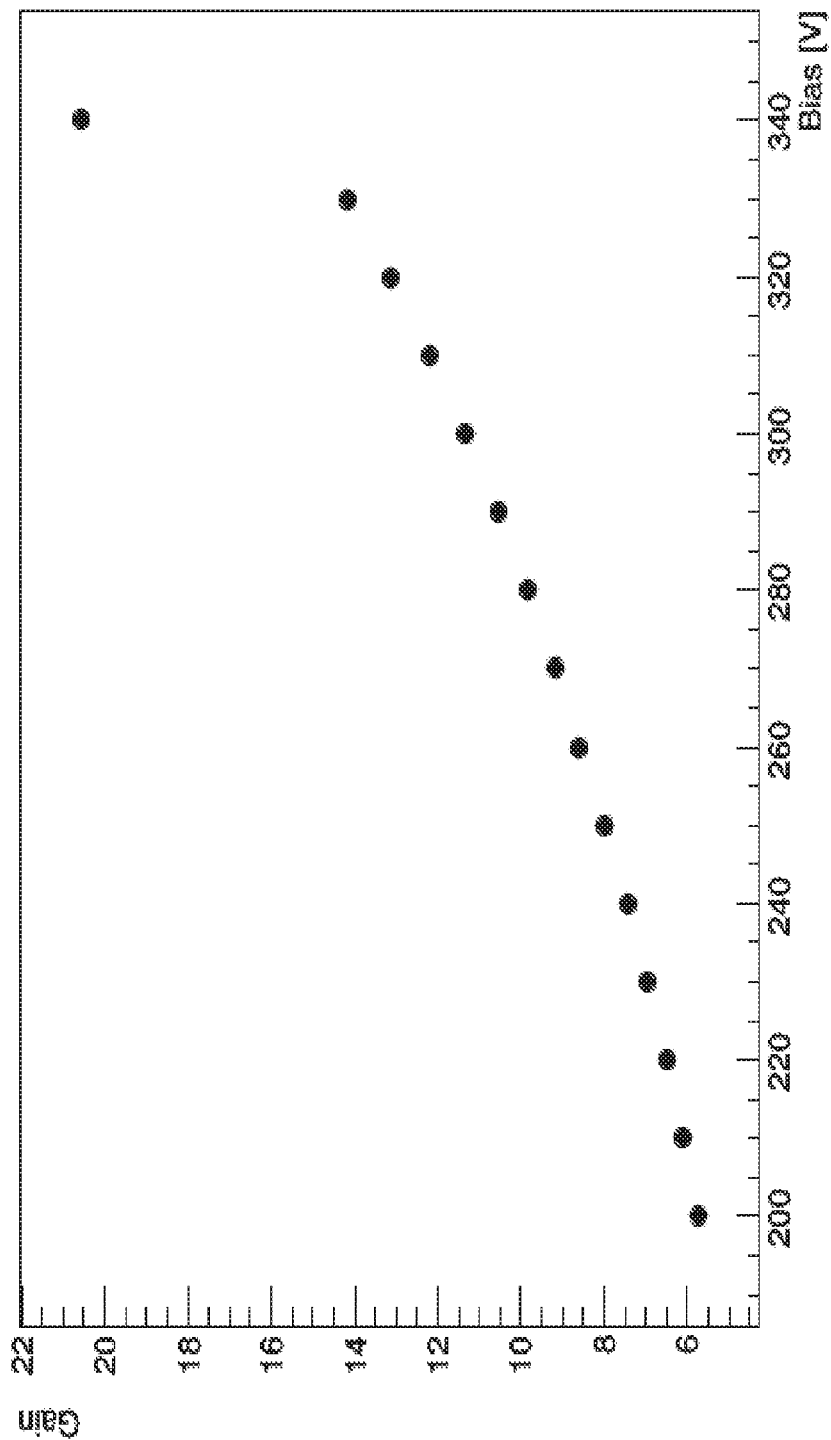
FIG. 4: Gain as a function of bias voltage for the Baseline-1 configuration.

FIG. 3 shows the resulting two-dimensional electric field profile, as a function of depth into the Baseline-1 detector and of a lateral coordinate parallel to the surface of the device, fora bias voltage of 210V. For bias voltages above 100 Volts, the electric field in the p-type drift region and the n-type isolation region is relatively insensitive to the applied voltage, leading to stable charge collection properties. The impact ionization process, which depends upon electric field in the gain region, is also well controlled, leading to the smooth dependence of gain upon bias voltage shown in FIG. 4.

Figure 5:
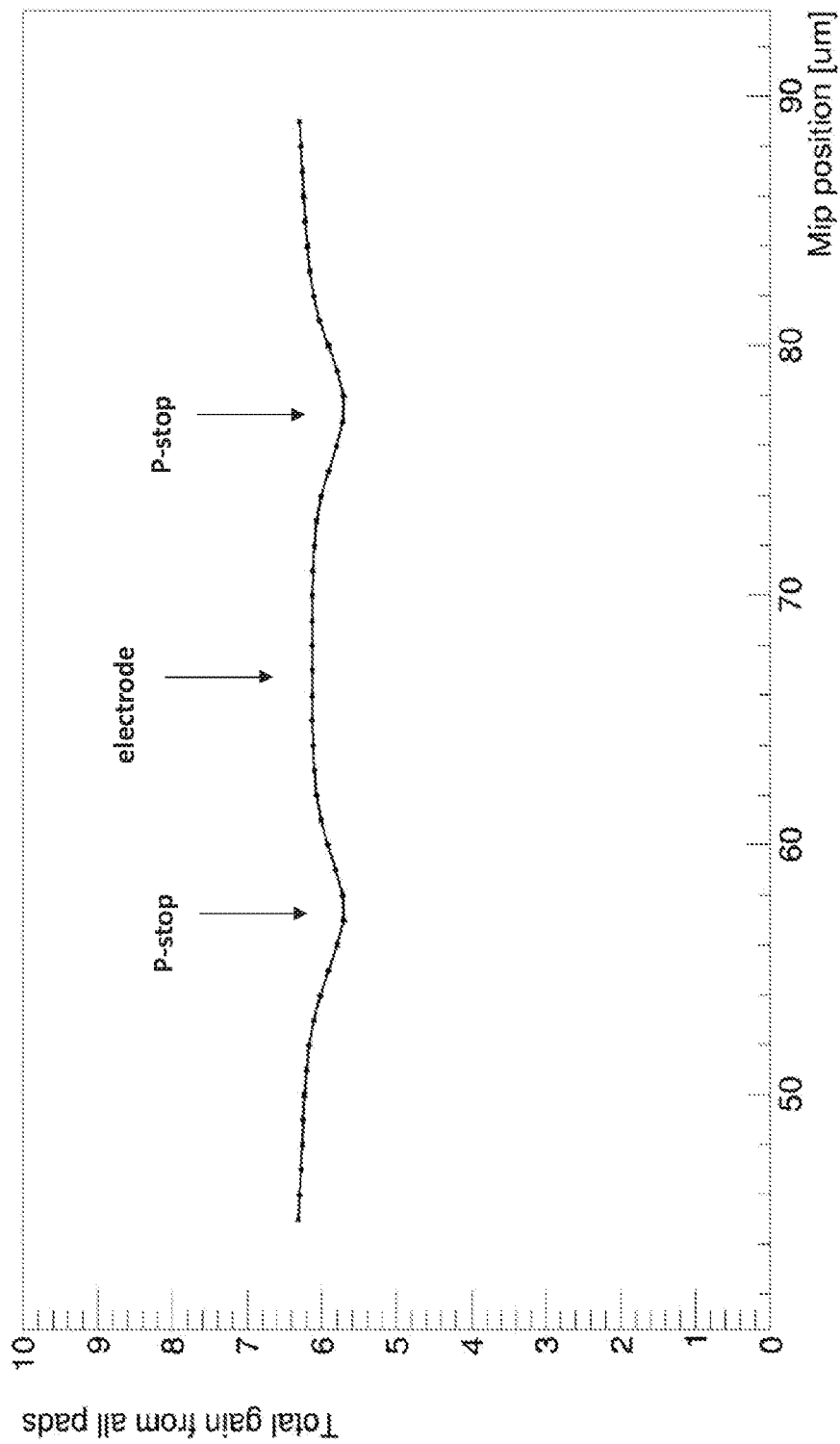
FIG. 5: Integrated signal charge, summed over all channels, as a function of transverse position, for a pixel separation of 20 μm within the Baseline-1 model.

FIG. 5 shows the gain variation as a function of lateral position that results from the electric field depicted in FIG. 3; uniformity at the +/−4% level is observed. Gain is defined by the collected charge in the LGAD over the collected charge in a same thickness silicon sensor without the gain layer structure.

Figure 6:
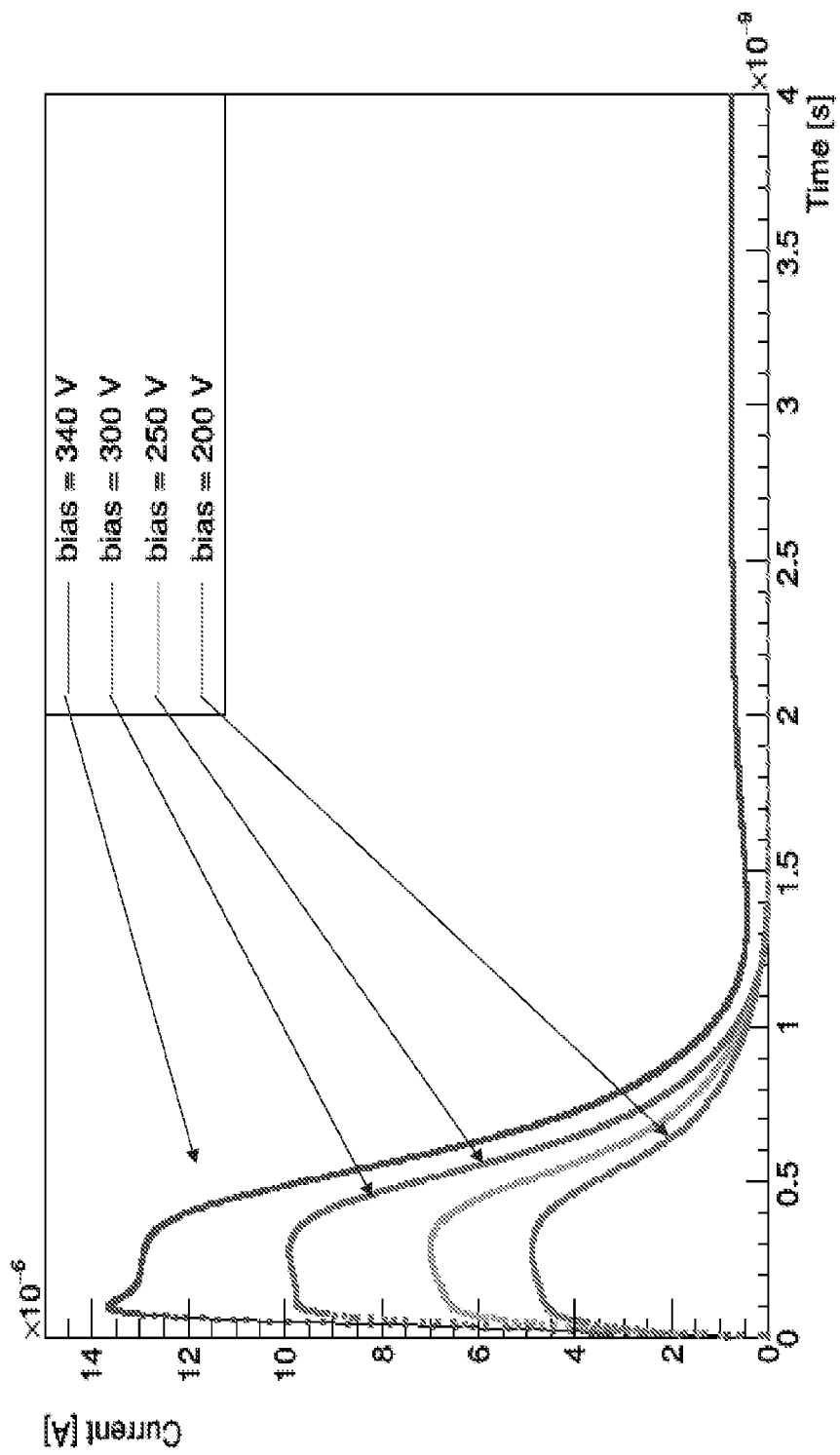
FIG. 6: Temporal signal profile as a function of bias voltage for the Baseline-1 configuration.

FIG. 6 shows the temporal signal profile as a function of applied bias voltage (obtained using the simulation). A sharp rising edge, conducive to a fast timing measurement, is observed for all bias voltages, with a slew-rate that grows monotonically with bias voltage. Consistent with the saturation drift velocity (approximately 100 μm per nanoseconds) of carriers in silicon, the majority of the charge within this 50 μm device is collected within 500 picoseconds, suggesting an achievable device repetition rate in excess of 1 GHz.

Process Steps

Figure 7:
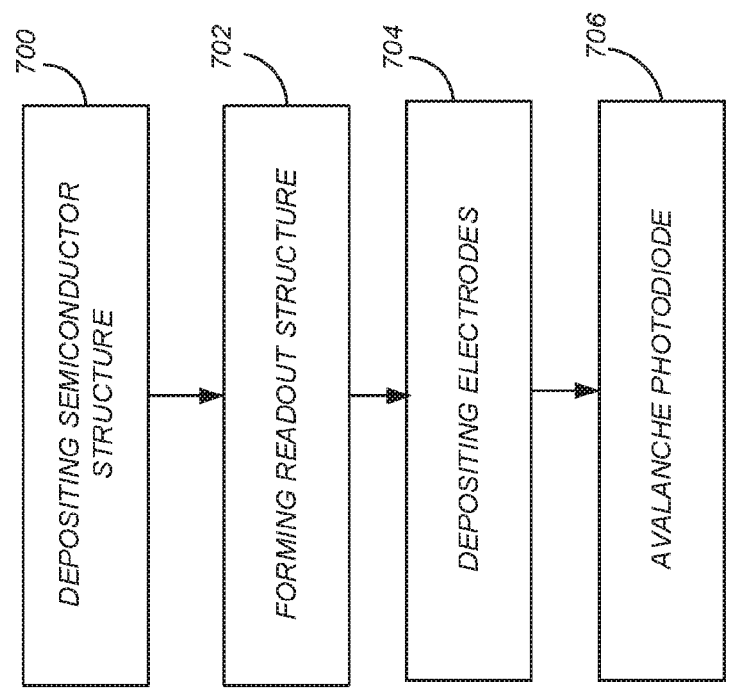
FIG. 7. Flowchart illustrating a method of making an avalanche diode.

FIG. 7 is a flowchart illustrating a method of making an avalanche diode (referring also to FIG. 2).

Block 700 represents obtaining or creating a semiconductor structure (e.g., epitaxial layers) on a substrate. In one or more examples, the semiconductor structure is a silicon semiconductor structure and the substrate is a silicon substrate (or the semiconductor structure and the substrate may comprise or consist essentially of silicon). In one example, the semiconductor structure includes a bulk p-type region; a gain region including a p-n junction on or above the bulk p-type region; and an n-type region (isolation region) on or above the gain region (n-side up configuration). In another example, the semiconductor structure includes a bulk n-type region; a gain region including a p-n junction on or above the bulk n-type region; and the p-type region (isolation region) on or above the gain region (p-side up configuration). The gain region includes an $n^+$-type region having a higher n-type dopant density than the n-type region; a $p^+$-type region having a higher p-type dopant density than the p-type region; and the p-n junction between the $n^+$-type region and the $p^+$-type region. The $p^+$-type region typically forms a junction interface in physical contact with the $n^+$-type region. Example p-type dopants include, but are not limited to, boron, gallium, aluminum, and indium. Example n-type dopants include, but are not limited to, phosphorus, arsenic, antimony, bismuth and lithium.

Block 702 represents forming a readout structure so that the surface of the n-type (p-type) region forms the readout structure. The step comprises defining a plurality of segments in the n-type region or the p-type region depending on the configuration (n-side up or p-side up).

Block 704 represents creating or generating (e.g., depositing) a plurality of first electrodes forming an ohmic contact with the readout structure and a second electrode forming an ohmic contact with the p-type (n-type) region. At least one of the first electrodes is on each of the segments and the first electrodes on different segments are electrically isolated from one another. Established segmentation schemes for conventional (non-LGAD) silicon diode sensors may also be used. The step further comprises forming a first ohmic contact between the implanted regions and the first electrodes, and a second ohmic contact between the bulk p-type region and the bulk n-type region and a second electrode, so that the p-n junction is reverse biased by application of an electric field of appropriate polarity between the first electrodes and the second electrode. The second ohmic contact is typically formed on a second surface of the semiconductor structure opposite the first surface.

Block 706 represents the end result, an avalanche diode. The avalanche diode can be used in many applications, including but not limited to, as a pixel sensor (e.g., at the large hadron collider (LHC) or proposed Electron-Ion Collider (EIC)) with fast timing capabilities.

The avalanche diode can be embodied in many ways including, but not limited to, the following (referring also to FIG. 2).

1. An avalanche diode 200, comprising a semiconductor structure 202 including a first region 204a doped with a first polarity type dopant (n-type or p-type); a second region 206a doped with a second polarity type dopant (n-type or p-type and opposite polarity to the first polarity type dopant); and a gain region 208 between the first region and the second region. The first region 204a includes a plurality of segments 218 each including implanted regions 232 having a higher dopant density than the first region. In a first possibility, the first region 204a comprises an n-type region 204 and the second region 206a comprises a p-type region 206. In a second possibility, the first region comprises a p-type region and the second region comprises an n-type region. These two possibilities are expressed herein as the first region 204a comprising an n-type (p-type) region and the second region comprising a p-type (n-type) region 206 which define the second region as being p-type when the first region is n-type and the second region as being n-type when the first region is p-type.

The gain region 208 is buried between the n-type (p-type) region 204a and the p-type (n-type) region 206a and the gain region 208 includes:

an n$^+$-type region 212 having a higher n-type dopant density than the n-type region 204;

a p$^+$-type region 214 having a higher p-type dopant density than the p-type region 206; and a p-n junction 210 between the n$^+$-type region 212 and the p$^+$-type region 214;

a readout structure 222 comprising a plurality of first electrodes 224, wherein at least one of the first electrodes is on each of the segments 218 and the first electrodes on different segments are electrically isolated from one another;

a first ohmic contact between the implanted region and the first electrode 224 on the implanted region (e.g., a first ohmic contact between each of the implanted regions and the one of the first electrodes on the each of the implanted regions);

a second ohmic contact 230 between the p-type (n-type) region and a second electrode 226; and wherein the p-n junction 210 experiences a reverse bias electric field when an appropriate polarity bias is applied between the first electrodes 224 and the second electrode 226.

2. The avalanche diode of example 1, wherein e semiconductor structure consists essentially of silicon.

3. The avalanche diode of example 1 or example 2, further comprising:

a first surface 216 of the n-type (p-type) region 204a;

the p-n junction 210 comprising a first interface 210a between the n$^+$-type region and the p$^+$-type region; and a first distance D1 between the first interface 210a and the first surface 216, wherein the first distance D1 is in a range of 2-10 micrometers (e.g., 2 micrometers≤D1≤10 micrometers), as illustrated in FIG. 2.

4. The avalanche diode of example 3, wherein the first distance D1 is in a range of 3-6 micrometers (e.g., 3 micrometers≤D1≤6 micrometers).

5. The avalanche diode of any of the preceding examples, wherein:

the n$^+$-type region 212 has a first n-type dopant density and the p$^+$-type region 214 has a first p-type dopant density, and the first n-type dopant density is within 10% (e.g., within 5%, or within 1%) of the first p-type dopant density, or the same as the first p-type dopant density.

6. The avalanche diode of example 5, wherein the first n-type dopant density $N_{D1}$ and the first p-type dopant density $N_{A1}$ are in a range of 2.6e^16-3.8e^16 dopant atoms per cm$^3$ (e.g., of 2.6e^16≤$N_{D1}$, $N_{A1}$≤3.8e^16).

7. The avalanche diode of any of the preceding examples, wherein:

the n-type region 204 has a second n-type dopant density $N_{D2}$ in a range of 1e^12-1e^14 atoms per cm$^3$ (e.g., of 1e^12≤$N_{D2}$≤1e^14), and the p-type region 206 has a second p-type dopant density $N_{A2}$ in a range of 1e^12-1e^14 atoms per cm$^3$ (e.g., of 1e^12≤$N_{A2}$≤1e^14).

8. The avalanche diode of any of the preceding examples, further comprising:

a second surface 228 of the p-type (n-type) region on a side of the semiconductor structure opposite the first surface 216; and a second distance D2 (as illustrated in FIG. 2), between the second surface 228 and the first interface 210a, in a range of 20 micrometers to 100 micrometers (e.g., 20 micrometers≤D2≤100 micrometers).

9. The avalanche diode of any of the preceding examples, wherein:

when the avalanche diode 200 experiences the reverse bias electric field, a first n-type dopant density in the n$^+$-type region 212 and a second p-type dopant density in the p$^+$-type region 214 are in a range that achieves gain using impact ionization in the p-n junction 210 without breakdown of the p-n junction 210; and a second n-type dopant density in the n-type region 204 and a second p-type dopant density in the p-type region 206 are in a range such that:

the reverse bias electric field does not induce impact ionization in the n-type region 204 or the p-type region 206, the second p-type dopant density enables saturation of the drift velocity in the p-type region 206, and the second n-type dopant density enables saturation of the drift velocity in the n-type region 204.

10. The avalanche diode of any of the preceding examples, wherein:

starting at full depletion and as a function of increasing reverse bias voltage across the first electrodes 224 and second electrode 226, a gain of the diode increases monotonically (e.g., always upwards) until breakdown in the p-n junction 210; and the gain is characterized as the response of the diode 200 with the p-n junction 210 divided by the response of the diode having:

the p$^+$-type region 214 replaced with a continuation of the p-type region 206 (having the same thickness as the p$^+$-type region) and the n$^+$-type region 212 replaced with a continuation of the n-type region 204 (having the same thickness as the n$^+$-type region).

11. The avalanche diode of any of the preceding examples, wherein:

each of the segments 218 has a surface area A of 3 by 3 micrometers or greater, or the number density of the segments is up to 10$^5$ segments per square millimeter.

12. The avalanche diode of any of the preceding examples, further comprising:

an electrostatic isolation barrier 234, comprising p-type (n-type) dopants, between adjacent segments, wherein:

the barriers electrically isolate the first electrodes 224 from each other, and the barriers extend to a depth D3 that does not reach the p-n junction 210.

13. The avalanche diode of example 12, wherein the barriers 234 comprise a third p-type (n-type) dopant density $N_3$ in a range of 1e^12-1e^14 dopant atoms per cm$^3$ (e.g., 1e^12≤N3≤1e^14).

14. The avalanche diode of examples 6, 7 and 12:

wherein the dopant densities in the semiconductor structure 202 are tuned so that the gain of the diode 200, as a function of position along a length L of the segment, in any direction parallel to the first surface 216, does not vary by more than +/−10%.

15. The avalanche diode of example 14, wherein for the p-type (n-type) region comprising a bulk region having a thickness D4 of 50 micrometers or less, the majority (e.g., greater than 90%) of the signal charge is collected within 500 picoseconds, enabling a repetition rate in excess of 1 GHz.

16. The avalanche diode of any of the preceding examples, wherein the implanted regions 232 comprise a fourth n-type (p-type) dopant density N in a range of 1e^17-1e^19 dopant atoms per cm$^3$ (e.g., 1e^17≤N_4≤1e^18).

17. The avalanche diode 200 of any of the preceding examples, wherein the diode does not include a Junction Termination Extension (JTE) structure between the segments.

18. The avalanche diode of any of the preceding examples, wherein:

the n-type (p-type) region including a plurality of segments 218 comprises an n-type region 204, and the p-type (n-type) region comprises a p-type bulk region 206 so that the second ohmic contact 230 is between the p-type bulk region 206 and the second electrode 226, as illustrated in FIG. 2.

The avalanche diode of any of the preceding examples, wherein:

the n-type (p-type) region including a plurality of segments comprises a p-type region (i.e., the n-type region 204 in FIG. 2 is a p-type region), and the p-type (n-type) region comprises a n-type hulk region p-type region 206 is an n-type region) so that the second ohmic contact is between the n-type bulk region and the second electrode.

20. A method of making an avalanche diode, comprising:
obtaining or creating a semiconductor structure including:
an n-type (p-type) region;
a p-type (n-type) region; and
a gain region between the n-type region and the p-type region, the gain region buried between the n-type region and the p-type region and the gain region including:
an n$^+$-type region having a higher n-type dopant density than the n-type region;
a p$^+$-type region having a higher p-type dopant density than the p-type region; and
a p-n junction between the n$^+$-type region and the p$^+$-type: region;
the surface of the n-type (p-type) region forming a readout structure, comprising:

a plurality of segments in the n-type (p-type) region, each of the segments including implanted regions having a higher dopant density than the n-type (p-type) region;

generating a plurality of first electrodes, wherein at least one of the first electrodes is on each of the segments and the first electrodes on different segments are electrically isolated from one another;

forming a first ohmic contact between each of the implanted regions and the one of the first electrodes on the each of the implanted regions; and forming a second ohmic contact between the p-type (n-type) region and a second electrode, so that the p-n junction is reverse biased by application of an electric field of appropriate polarity between the first electrodes and the second electrode.

21. The method of example 20, wherein the semiconductor consists essentially of silicon.

22. The method of example 20 or 21, wherein the first electrodes are DC coupled to the implanted regions.

23. The method or device of any of the preceding examples wherein:

an electron (hole) is generated in the p-type (n-type) region 206a (comprising a bulk region) in response to incident charged particle(s) or photon(s), including X-rays;

the electron (hole), accelerated in the reverse bias electric field applied across the gain region 208, generates additional electrons (holes) in the gain region through impact ionization in the gain region, and the n-type (p-type) region 204a (including the segments 218) isolates the first electrodes 224 from electric fields in the gain region so that there is no breakdown between the implanted regions 232 while allowing the additional electrons (holes) to drift from the gain region 208 through the n-type (p-type) region 204a to the first electrodes 224.

24. The method or device of any of the preceding examples, wherein the readout structure comprises the segments and the first electrodes on the segments, so that when the readout structure is electrically connected in or to a readout circuit, the readout circuit measures a quantity of the charged particles (electrons or holes) collected on the first electrodes in response to charged particle(s) or photon(s) (including X-rays) incident on the avalanche diode.

Advantages and Improvements

As described above, conventional LGADs are biased with high electric fields required to induce the impact ionization process, leading to breakdown between the separated n-p junctions that are used to simultaneously deplete the sensors and establish the readout segmentation. As a result, working LGAD devices have included a Junction Termination Extension (JTE) that provides electrostatic isolation between neighboring implants, but at the cost of introducing a dead region between the sensor segments that is insensitive to the deposited charge from an incident particle. The width of this dead region is 50 μm or more, making conventional LGAD sensors inefficient for granularity scales much below 1 mm. The following devices have been proposed to circumvent the JTE limit.

(1) AC-coupled ("AC-LGAD") LGADs that eliminate the need for the JTE by making use of a completely planar (non-segmented) junction structure, while establishing the granularity entirely through the electrode structure, which is AC-coupled to the planar device through a thin layer of insulator. Since charge is not collected directly by the electrodes, there is a point-spread function that relates the signal location to the pad (electrode) response that is a property of the effective AC network formed by the highly doped gain layer just below the insulating layer and the electrode structure. The AC coupling also leads to a signal that is zero when integrated over all time, leading to a recovery period for which the polarity of collected charge is of opposite polarity to that of the signal pulse, potentially compromising the repetition rate of the device.

(2) Inverse ("ILGAD") LGADs also eliminate the need for the JTE by making use of a planar junction structure. In this case, the electrode structure is placed on the side of the device opposite the junction. However, prototypes with appealing signal characteristics have yet to be achieved. In addition, the manufacture of these devices requires processing on both sides of the sensor, which is significantly more difficult than the single-sided processes used for conventional, AC, and DJ LGADs.

(3) Trench-isolated ("TI-LGAD") LGADs attempt to replace the JTE with a physical trench etched around the edge of the detector segment, which is then filled with insulator. This structure might be used to reduce the dead area between segments to as little as 5 µm. However, much work remains to be done to show that this approach will produce a stable sensor, and to see how small the dead region can be made.

Therefore, these approaches (1)-(3) for increasing LGAD granularity make use of more complex, and less proven segmentation techniques. Exemplary device embodiments described herein, on the other hand, include the diode junction gain layer buried below a lightly-doped isolation layer, enabling the use of conventional segmentation techniques to achieve high granularity. This allows for the removal of constraints on the granularity of LGADs while maintaining their attractive properties of internal gain, timing resolution and repetition rate.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An avalanche diode, comprising:
a semiconductor structure including:
an n-type (p-type) region including a plurality of segments each including an implanted region having a higher dopant density than the n-type (p-type) region;
a p-type (n-type) region; and
a gain region between the n-type (p-type) region and the p-type (n-type) region, the gain region buried between the n-type (p-type) region and the p-type (n-type) region and the gain region including:
an $n^+$-type region having a higher n-type dopant density than the n-type region;
a $p^+$-type region having a higher p-type dopant density than the p-type region; and
a p-n junction between the $n^+$-type region and the $p^+$-type region;
a readout structure comprising a plurality of first electrodes, wherein at least one of the first electrodes is on each of the segments and the first electrodes on different segments are electrically isolated from one another;
each of segments including a first ohmic contact between the implanted region and the at least one of the first electrodes on the implanted region;
a second ohmic contact between the p-type (n-type) region and a second electrode; and
wherein the p-n junction experiences a reverse bias electric field when an appropriate polarity bias is applied between the first electrodes and the second electrode;
a plurality of electrons (holes) is generated in the p-type (n-type) region in response to incident charged particle (s) or photons;
the electrons (holes), accelerated in the reverse bias electric field applied across the gain region, generate additional electrons (holes) in the gain region through impact ionization in the gain region, and
the n-type (p-type) region (including the segments) isolates the first electrodes from electric fields in the gain region so that there is no breakdown between the implanted regions while allowing the additional electrons (holes) to drift from the gain region through the n-type (p-type) region to the first electrodes.

2. The avalanche diode of claim 1, wherein the semiconductor structure consists essentially of silicon.

3. The avalanche diode of claim 1, further comprising:
a first surface of the n-type (p-type) region;
the p-n junction comprising a first interface between the $n^+$-type region and the $p^+$-type region; and
a first distance D1 between the first interface and the first surface is less than or equal to 100 micrometers.

4. The avalanche diode of claim 3, wherein the first distance is in a range of 3-6 micrometers.

5. The avalanche diode of claim 3, further comprising:
a second surface of the p-type (n-type) region on a side of the semiconductor structure opposite the first surface; and
a second distance, between the second surface and the first interface, in a range of 20 micrometers to 100 micrometers.

6. The avalanche diode of claim 3, wherein D1 is in a range of 2-10 micrometers.

7. The avalanche diode of claim 1, wherein:
the $n^+$-type region has a first n-type dopant density and the $p^+$-type region has a first p-type dopant density, and
the first n-type dopant density is within 10% of the first p-type dopant density.

8. The avalanche diode of claim 7, wherein the first n-type dopant density and the first p-type dopant density are in a range of $2.6e \wedge 16$-$3.8e \wedge 16$ dopant atoms per $cm^3$.

9. The avalanche diode of claim 8, wherein:
the n-type region has a second n-type dopant density in a range of $1e \wedge 12$-$1e \wedge 14$ atoms per $cm^3$, and
the p-type region has a second p-type dopant density in a range of $1e \wedge 12$-$1e \wedge 14$ atoms per $cm^3$.

10. The avalanche diode of claim 9, wherein the barriers comprise a third p-type (n-type) dopant density in a range of $1e \wedge 12$-$1e \wedge 14$ dopant atoms per $cm^3$.

11. The avalanche diode of claim 10, wherein the implanted regions comprise a fourth n-type (p-type) dopant density in a range of $1e \wedge 17$-$1.e \wedge 19$ dopant atoms per $cm^3$.

12. The avalanche diode of claim 9 further comprising:
a first surface of the n-type (p-type) region,
an electrostatic isolation barrier, comprising p-type (n-type) dopants, between adjacent segments, wherein:
the electrostatic isolation barriers electrically isolate the first electrodes from each other, and
the electrostatic isolation barriers extend to a depth that does not reach the p-n junction, and the dopant densities in the semiconductor structure are tuned so that the gain of the diode, as a function of position along a length of the segment, in any direction parallel to the first surface, does not vary by more than +/−10%.

13. The avalanche diode of claim 12, wherein for the p-type (n-type) region comprising a bulk region having a thickness of 50 micrometers or less, the majority of a signal charge, in response to incidence of charged particles or photons on the avalanche diode, is collected on the first electrodes within 500 picoseconds, enabling a repetition rate in excess of 1 GHz.

14. The avalanche diode of claim 1, wherein:
when the diode experiences depletion, the reverse bias electric field, a first n-type dopant density in the $n^+$-type region and a second p-type dopant density in the $p^+$-type region are in a range that achieves gain using impact ionization in the p-n junction without breakdown of the p-n junction; and
a second n-type dopant density in the n-type region and a second p-type dopant density in the p-type region are in a range such that:
the reverse bias electric field does not induce impact ionization in the n-type region or the p-type region,
the second p-type dopant density enables saturation of the drift velocity in the p-type region, and
the second n-type dopant density enables saturation of the drift velocity in the n-type region.

15. The avalanche diode of claim 1, wherein:
starting at full depletion and as a function of increasing reverse bias voltage across the first electrodes and second electrode, a gain of the avalanche diode increases monotonically until breakdown in the p-n junction; and
the gain is characterized as the response of the avalanche diode with the p-n junction divided by the response of the diode having:
the $p^+$-type region replaced with a continuation of the p-type region (having the same thickness as the $p^+$-type region), and
the $n^+$-type region replaced with a continuation of the n-type region (having the same thickness as the $n^+$-type region).

16. The avalanche diode of claim 1, wherein:
each of the segments has a surface area of 3 by 3 micrometers or greater, or the number density of the segments is up to $10^5$ segments per square millimeter.

17. The avalanche diode of claim 1, further comprising:
an electrostatic isolation barrier, comprising p-type (n-type) dopants, between adjacent segments, wherein:
the electrostatic isolation barriers electrically isolate the first electrodes from each other, and
the electrostatic isolation barriers extend to a depth that does not reach the p-n junction.

18. The avalanche diode of claim 1, wherein the avalanche diode does not include a Junction Termination Extension (JTE) structure between the segments.

19. The avalanche diode of claim 1, wherein:
the n-type (p-type) region, including the plurality of segments, comprises an n-type (p-type) region, and
the p-type (n-type) region comprises a p-type bulk region so that the second ohmic contact is between the p-type (n-type) bulk region and the second electrode.

20. The avalanche diode of claim 1, wherein the photons comprise X-ray photons.

21. A method of making an avalanche diode, comprising:
obtaining or creating a semiconductor structure including:
an n-type (p-type) region;
a p-type (n-type) region; and
a gain region between the n-type region and the p-type region, the gain region buried between the n-type region and the p-type region and the gain region including:
an $n^+$-type region having a higher n-type dopant density than the n-type region;
a $p^+$-type region having a higher p-type dopant density than the p-type region; and
a p-n junction between the $n^+$-type region and the $p^+$-type region;
the surface of the n-type (p-type) region forming a readout structure, comprising:
a plurality of segments in the n-type (p-type) region, each of the segments including an implanted region having a higher dopant density than the n-type (p-type) region;
generating a plurality of first electrodes, wherein at least one of the first electrodes is on each of the segments and the first electrodes on different segments are electrically isolated from one another;
forming a first ohmic contact between each of the implanted regions and the one of the first electrodes on the each of the implanted regions; and
forming a second ohmic contact between the p-type (n-type) region and a second electrode, so that the p-n junction is reverse biased by application of an electric field of appropriate polarity between the first electrodes and the second electrode; and wherein:
a plurality of electrons (holes) is generated in the p-type (n-type) region in response to incident charged particle (s) or photons;
the electrons (holes), accelerated in the reverse bias electric field applied across the gain region, generate additional electrons (holes) in the gain region through impact ionization in the gain region, and
the n-type (p-type) region (including the segments) isolates the first electrodes from electric fields in the gain region so that there is no breakdown between the implanted regions while allowing the additional electrons (holes) to drift from the gain region through the n-type (p-type) region to the first electrodes.

22. The method of claim 21, wherein the semiconductor consists essentially of silicon and the first electrodes are DC coupled to the implanted regions.

23. The method of claim 21, wherein the photons comprise X-ray photons.

* * * * *